US007397924B2

(12) United States Patent
Praestgaard et al.

(10) Patent No.: US 7,397,924 B2
(45) Date of Patent: Jul. 8, 2008

(54) MODULAR LOUDSPEAKER

(75) Inventors: Poul Praestgaard, Struer (DK); Emanuel LaCarrubba, Novato, CA (US); David Moulton, Groton, MA (US)

(73) Assignee: Bang & Olufsen A/S, Struer (DK)

( * ) Notice: Subject to any disclaimer, the term of this patent is extended or adjusted under 35 U.S.C. 154(b) by 44 days.

(21) Appl. No.: 10/503,003

(22) PCT Filed: Jan. 29, 2002

(86) PCT No.: PCT/DK02/00064

§ 371 (c)(1), (2), (4) Date: May 4, 2005

(87) PCT Pub. No.: WO03/065761

PCT Pub. Date: Aug. 7, 2003

(65) Prior Publication Data

US 2005/0207593 A1 Sep. 22, 2005

(51) Int. Cl.
*H03G 5/00* (2006.01)

(52) U.S. Cl. ........................................................ 381/99

(58) Field of Classification Search .................. 381/96, 381/98–99, 58–59, 103, 335; 700/94
See application file for complete search history.

(56) References Cited

U.S. PATENT DOCUMENTS

| | | | | |
|---|---|---|---|---|
| 4,133,975 | A * | 1/1979 | Barker, III | 381/303 |
| 4,887,298 | A * | 12/1989 | Haigler | 381/55 |
| 6,067,224 | A * | 5/2000 | Nobuchi | 361/683 |
| 6,148,243 | A * | 11/2000 | Ishii et al. | 700/94 |
| 6,292,358 | B1 * | 9/2001 | Lee et al. | 361/683 |
| 6,983,053 | B2 * | 1/2006 | Lee et al. | 381/99 |
| 7,016,509 | B1 * | 3/2006 | Bharitkar et al. | 381/98 |

FOREIGN PATENT DOCUMENTS

| | | | |
|---|---|---|---|
| JP | 54-63623 | U | 5/1979 |
| JP | 11-220790 | A | 8/1999 |
| JP | 2000-287294 | A | 10/2000 |

* cited by examiner

*Primary Examiner*—Vivian Chin
*Assistant Examiner*—Lun-See Lao
(74) *Attorney, Agent, or Firm*—Stites Harbison PLLC; Ross F. Hunt, Jr.

(57) ABSTRACT

The present invention relates to a modular loudspeaker, primarily intended to be used as a studio monitor and comprising a broadband module for radiating a first frequency range with a lower limiting frequency sufficiently low to provide a fully acceptable reproduction in many situations and furthermore provided with a high frequency radiating unit (and possibly also a mid frequency radiating unit), the directional characteristics of which relative to the cabinet of the module can be controlled. The modular loudspeaker according to the invention furthermore comprises one or more low frequency module(s) for radiating a second frequency range which may at least partially overlap said first frequency range for either increasing the acoustical output at the lower end of the frequency range radiated by the broadband module or for extending the lower limiting frequency of the complete modular loudspeaker below the lower limiting frequency of the broadband module. The modular loudspeaker according to the invention is furthermore provided with means for transmission of information about the presence—and number—of low frequency modules applied in order to automatically change appropriate signal processing parameters in order to obtain a given target response of the complete modular loudspeaker.

16 Claims, 9 Drawing Sheets

MODULAR LOUDSPEAKER

TECHNICAL FIELD

The present invention relates to loudspeakers and more particularly to loudspeakers suitable for the application as monitors in sound studios or the like.

BACKGROUND OF THE INVENTION

A problem typically encountered during mixing sessions carried out in a sound studio arises when several persons (for instance one or more sound engineers and one or more artists listening to recordings of a performance) listen to playbacks of recordings over monitor loudspeakers which are typically located above the back edge of the mixing console. During such sessions the persons listening to the recordings may for instance be seated along the front of the mixing console, i.e. at various positions relative to a line extending between a set of loudspeakers in a traditional stereophonic reproduction set-up, and some of the persons may even be moving around in the mixing room. Due to the directional characteristics of the loudspeakers especially at high frequencies, the listeners located at different positions relative to the loudspeakers will perceive undesirable timbral variations and variations in the perceived sound image, such variations possibly also originating from sound reflections from the upper surface of the mixing console, etc. It is hence desirable to devise loudspeakers with radiation characteristics that will at least reduce such problems. It would furthermore be advantageous to be able to adapt the directional characteristics of the loudspeaker to the individual conditions prevailing in a specific mixing room, and to be able to choose between different orientations and locations of the cabinet of the loudspeaker without unwanted changes of the radiating pattern in the listening region of the room.

Especially during the last decade digital sound processing software for personal computers have become widespread, making it relatively simple and economic for instance for a professional artist or producer to set up his own "home studio" or other listening facility making it possible during a sound production to supplement listening sessions carried out in a sound studio with listening sessions carried out at home. It is, however, vitally important that the reproduced sound as far as possible has the same acoustical characteristics during listening sessions at home and in the studio, and at least one of the prerequisites for this is substantially similar characteristics of the monitor loudspeakers in the two places or at least substantially similar reproduction of those sound attributes that are decisive for the attainment of a desired sound image for instance during a mixing session.

DISCLOSURE OF THE INVENTION

Based on the above background, it is an object of the present invention to provide a loudspeaker which specifically can be applied as a studio monitor providing radiation characteristics that will at least reduce the above mentioned problems of undesirable timbral variations throughout the listening region.

It is a further object of the present invention to provide a loudspeaker which specifically can be applied as a studio monitor with adaptable directional characteristics, for instance at high frequencies, but also if desired at mid frequencies, so that these characteristics can be fitted to the individual conditions prevailing in a specific mixing room and furthermore making it possible to place the loudspeaker with any desired orientation relative to the listening room without substantially changing the high frequency and/or mid frequency radiation characteristics of the broadband module.

It is a further object of the present invention to provide a loudspeaker which specifically can be applied as a studio monitor which can easily be extended to provide increased acoustical output at low frequencies without causing undesirable changes of the acoustic characteristics, specifically the frequency response and radiation characteristics, already attained before said extension. It is thus an object to provide sound studios with a flexible possibility to extend the capabilities of their monitors as their requirements relating to low frequency performance of the monitors increase.

These and other objects and advantages are attained with a modular loudspeaker which specifically can be applied as a studio monitor, which according to the present invention comprises at least two separate modules, a broadband module, which can either be used alone, and which in itself provides high quality sound reproduction over a frequency range with a predefined lower limiting frequency being sufficiently low to provide acceptable low frequency reproduction for many practical applications, or be combined into one integrated unit with at least one low frequency module either for increasing the acoustic output at the low frequency end of the frequency range of the broadband module itself or for providing a lower limiting frequency of the entire unit below that of the broadband module itself. The modular loudspeaker according to the invention is thus not to be considered as a broadband unit combined with a subwoofer unit spaciously separated from the broadband unit but as a spaciously integrated unit.

According to one aspect of the invention there is thus provided a modular loudspeaker comprising:

- a broadband module (2) for the radiation of acoustical energy over a first frequency range;
- one or a plurality of low frequency module(s) (3, 3') for the radiation of acoustical energy over a second frequency range, which may at least partially overlap said first frequency range;
- one or a plurality of controllable pre-processing means for the pre-processing of audio signals (38) provided from an audio source (22) and for distribution of said pre-processed audio signals between said broadband module (2) and said at least one low frequency module (3, 3');
- means for providing and transferring control information (37, 37', 41) between said one or a plurality of low frequency module(s) (3, 3') and said one or a plurality of controllable pre-processing means, for indicating the presence and number of said low frequency modules (3, 3');

whereby said pre-processing means due to said control information can sense the presence and number of said one or a plurality of low frequency module(s) (3, 3') and thereby carry out appropriate changes of a set of signal processing parameters in order to obtain a given one of a set of predetermined target responses for the complete modular loudspeaker.

When said broadband and low frequency modules are combined to an integrated unit, a signal transmission is according to one embodiment of the invention established directly between these modules and the establishment of this transmission automatically changes the appropriate parameters of at least one of said modules in such a manner that the parameters (for instance frequency response and directional characteristics) of the combined modular loudspeaker are kept within given predetermined limits, i.e. corresponding to given known target characteristics. According to one embodiment of this aspect of the invention, which will be described in detail in the following, said signal transmission is established as a wired electrical connection, but it is understood that other types of transmissions could also be conceived without departing from the inventive idea as defined by the patent claims. Thus, for instance wireless signal transmission via radio (either directly or via a LAN) or infrared transmission would also in principle be possible, as would the use of fibre optics or similar means.

According to another embodiment of the present invention, when said broadband and low frequency modules are combined to an integrated unit, each of these modules are separately provided with input signals which could be pre-processed appropriately in order to keep the parameters (for instance frequency response and directional characteristics) of the combined modular loudspeaker within given predetermined limits, i.e. corresponding to given known target characteristics.

According to the present invention, said broadband module comprises high frequency radiating means and if desired also mid frequency radiating means, the directional characteristics of which, i.e. the acoustical radiation pattern, can be varied in order to adapt these characteristics to specific listening conditions prevailing in a given room and/or to different orientations of the broadband module chosen in the specific situation. According to one embodiment of the invention, this is accomplished by altering the orientation of said radiating means relative to the cabinet of the broadband module, the radiating means themselves being characterised by given fixed radiation patterns, but it is understood that a person skilled in the art may conceive other means for altering the radiation pattern of this means without necessarily changing the orientation of the radiating means relative to the cabinet of the broadband unit.

According to the present invention, said broadband module furthermore comprises radiating means with a sufficiently low lower limiting frequency to provide acceptable low frequency reproduction for many typical listening applications.

The broadband module as disclosed above may thus in many situations in itself provide a fully satisfactory solution as a monitor for sound studios and the like.

According to the present invention said broadband module furthermore comprises control means that among other things automatically change said lower limiting frequency and/or the overall output at the low frequency end of the frequency range of the combined modular loudspeaker, if the broadband module is coupled to said low frequency module, whereby the resulting frequency response and other pertinent acoustical characteristics of the integrated monitor fall within certain predefined limits corresponding to given target characteristics. Said control means may furthermore provide automatic compensation for the so-called baffle effect that arises due to acoustical interaction between the broadband module and the low frequency module, when said low frequency module is placed in close proximity to said broadband module and, furthermore for the increased acoustical output in that part of the frequency range of the integrated loudspeaker where a certain overlap between the frequency responses of the broadband and low frequency module takes place. Furthermore, said control means may be designed to be able to compensate for the acoustical effects on the frequency response of the monitor due to reflections from various obstacles in the listening room, for instance from the upper surface of a mixing console located beneath and in front of the monitor. Said compensation for the effect of reflections may of cause be provided by the control means not only in case of the combined monitor but also when using the broadband module alone.

According to the present invention, the low frequency output may be further extended by application of more than the one low frequency module as described above. In this case, the control means according to the invention also provides the further corrections for baffle effect and overlapping frequency responses as described above, which will be needed in case of more than one low frequency module.

The present invention and the various advantages hereof will be better understood by reference to the following detailed description of a preferred embodiment of a modular studio monitor according to the invention including the appended drawings hereof.

BRIEF DESCRIPTION OF THE DRAWINGS

The invention will now be described in more detail with reference to the accompanying drawings, in which.

DETAILED DESCRIPTION OF THE INVENTION

In the following, a detailed description of one embodiment of the invention is given.

Figure 1:
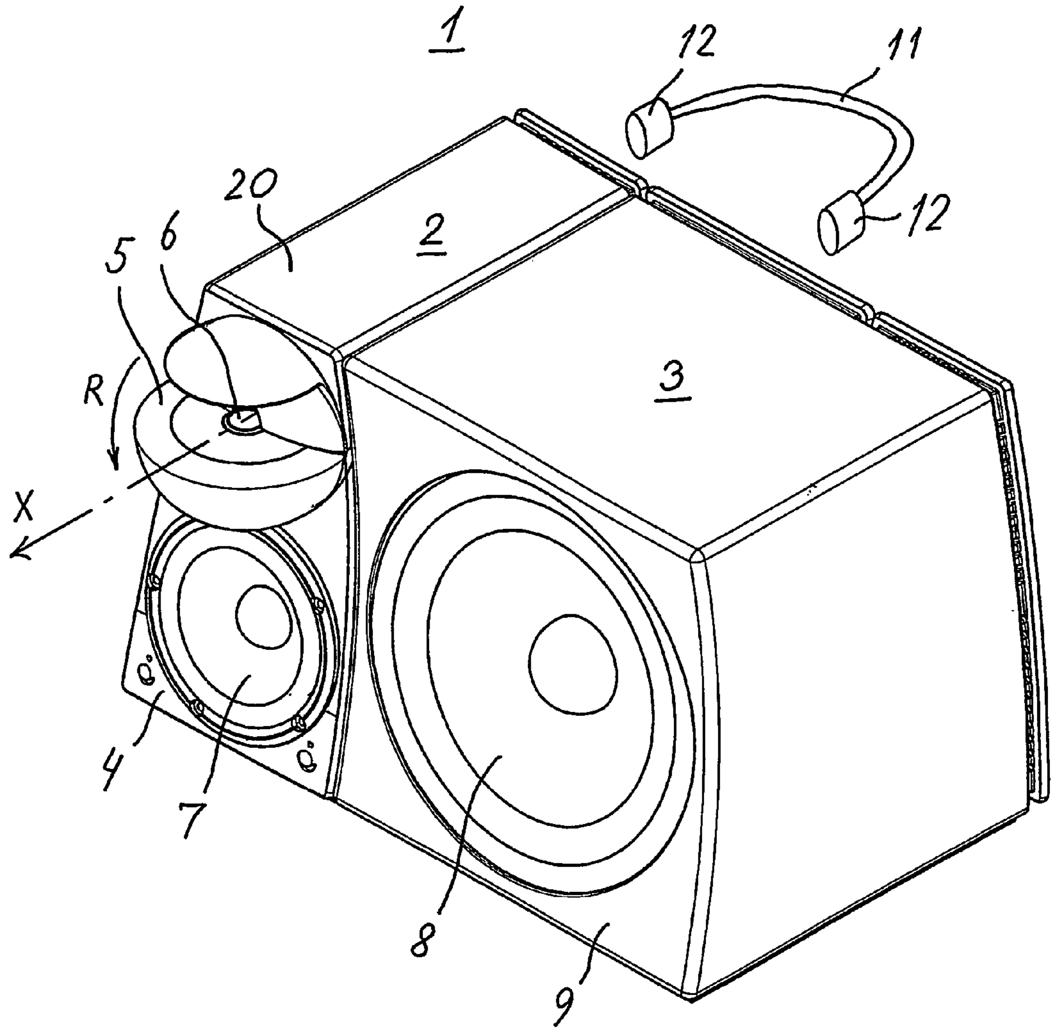
FIG. 1 is a perspective view of a modular studio monitor according to the present invention.

Referring to FIG. 1, there is shown an embodiment of a modular studio monitor according to the present invention generally referred to by reference numeral 1. The monitor 1 comprises two modules, a broad-band module 2 accommodating a high frequency driver unit 6, this unit being externally of the faceplate 4 provided with an acoustic lens 5 according to U.S. Pat. No. 6,068,080 mounted for rotation about an axis X through the driver unit and the lens 5 as indicated by the arrow R. The position of the acoustical lens 5 along the axis X relative to the face plate 4 of the broad-band module 2 is critical, as will be discussed in the following. The broadband module 2 furthermore comprises a combined mid range and low frequency loudspeaker unit 7 mounted in the faceplate 4 adjacent the acoustical lens 5. Apart from the above acoustical components, module 2 contains appropriate electronic circuitry comprising power amplifier, crossover network, frequency equalisation means and various control means.

The second module of the modular studio monitor 1 is a low frequency module 3 comprising a low frequency loudspeaker unit 8 and a power amplifier.

The broadband module 2 and the low frequency module 3 could be designed as closed box baffles, i.e. not provided with vents (as in bass reflex cabinets) or with passive radiating units, but vented cabinets or cabinets provided with passive radiating units may also be used.

Referring to FIGS. 2, 3, 4*a* and 4*b*, there is shown various possible configurations of one or two modular monitor(s) according to the invention.

Figure 2:
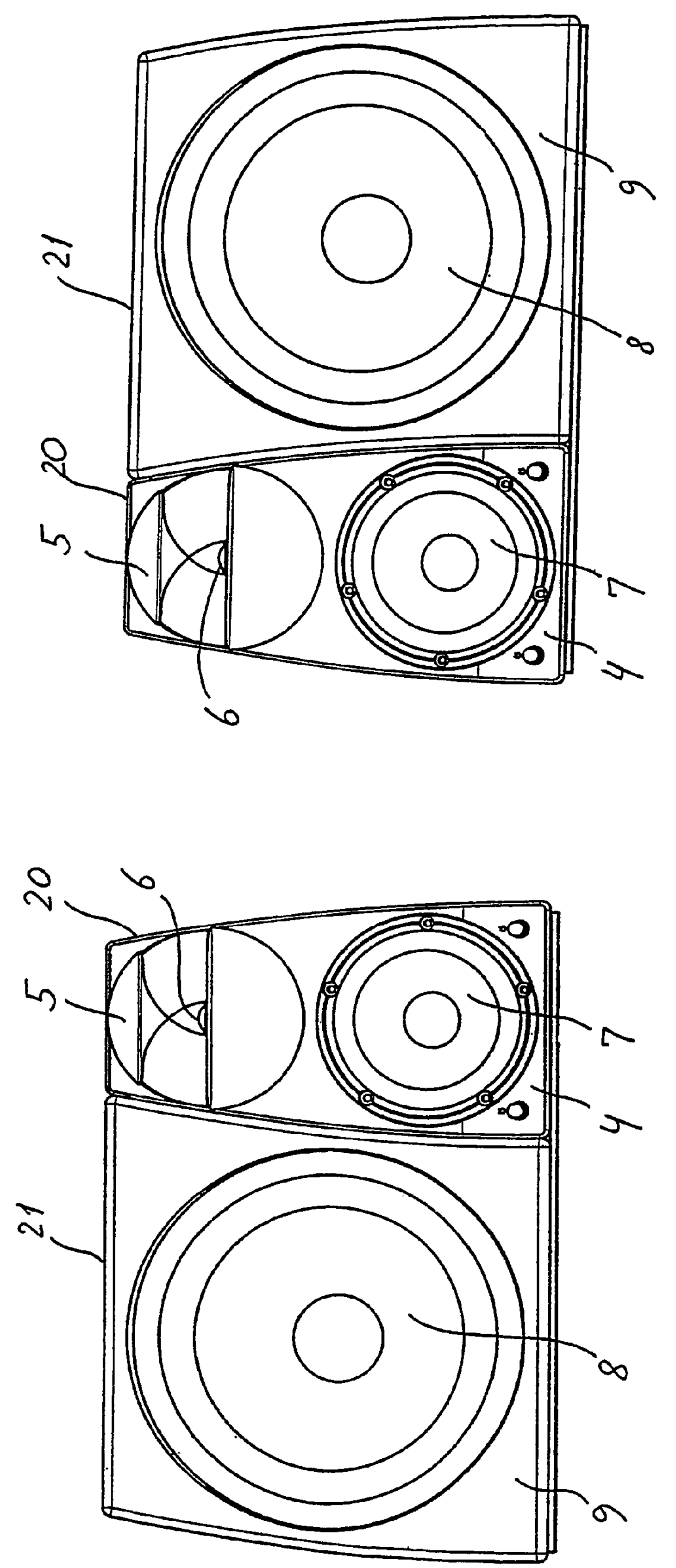
FIG. 2 is a stereophonic set-up of a pair of studio monitors according to the present invention.

Specifically FIG. 2 shows a stereophonic set-up comprising a pair of modular monitors according to the invention. Each pair comprises in this case both the broadband module 2 and the low frequency module 3 but it is understood that a stereophonic set-up only comprising a pair of broadband modules would also be possible as mentioned above. Furthermore, the relative configuration of the broadband and low frequency modules as shown in FIG. 2 is such that the broadband modules are placed nearest the vertical symmetry plane of the set-up with the low frequency modules placed farthest away from this plane. In principle, it would also be possible to place the broadband modules farthest away from the symmetry plane and the low frequency modules nearest this plane. The most beneficial solution must be decided on in the specific case.

The stereophonic set-up shown in FIG. 2 is symmetrical around the vertical centreplane between the left and right loudspeaker module. It is of cause also possible to apply an asymmetrical set-up with the broadband module of the right modular loudspeaker placed closest to the centreplane of the system and the broadband module of the left modular loudspeaker placed farthest away from the centreplane or vice versa. In fact, any placement of the broadband module and the low frequency module relative to each other is of cause possible according to the circumstances.

Figure 3:
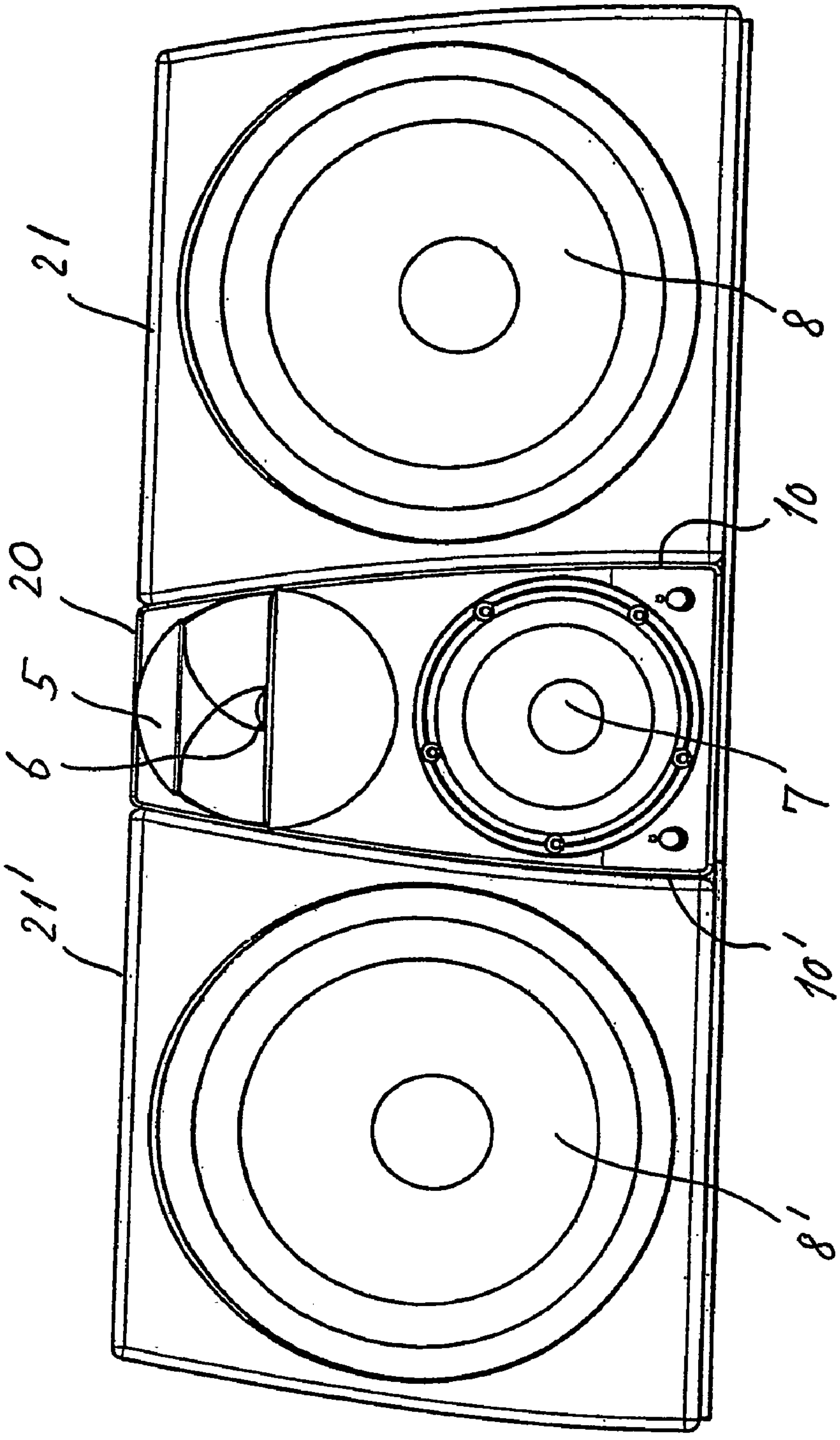
FIG. 3 is a front view of an extension of the modular studio monitor shown in FIG. 1 comprising two low frequency modules.
Figure 4A:
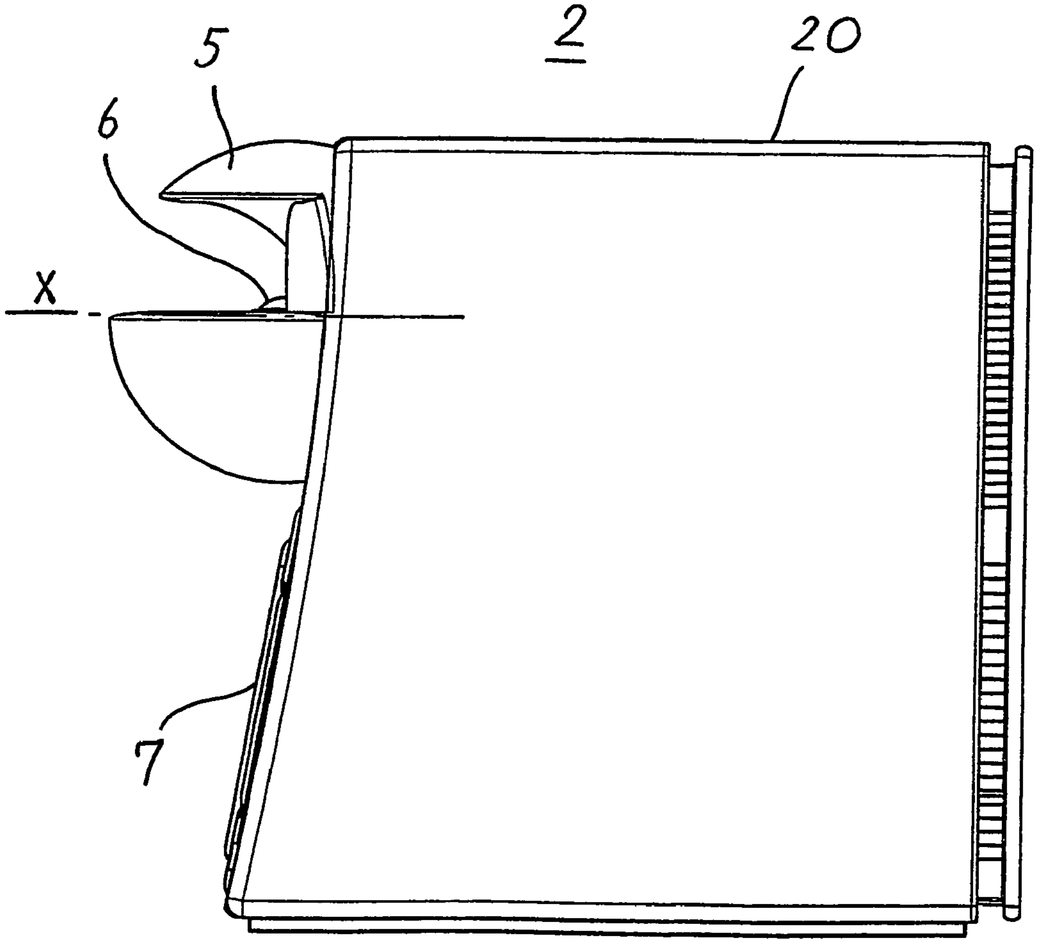
FIG. 4*a* is a side elevational view of one module of the monitor shown in FIG. 1.
Figure 4B:
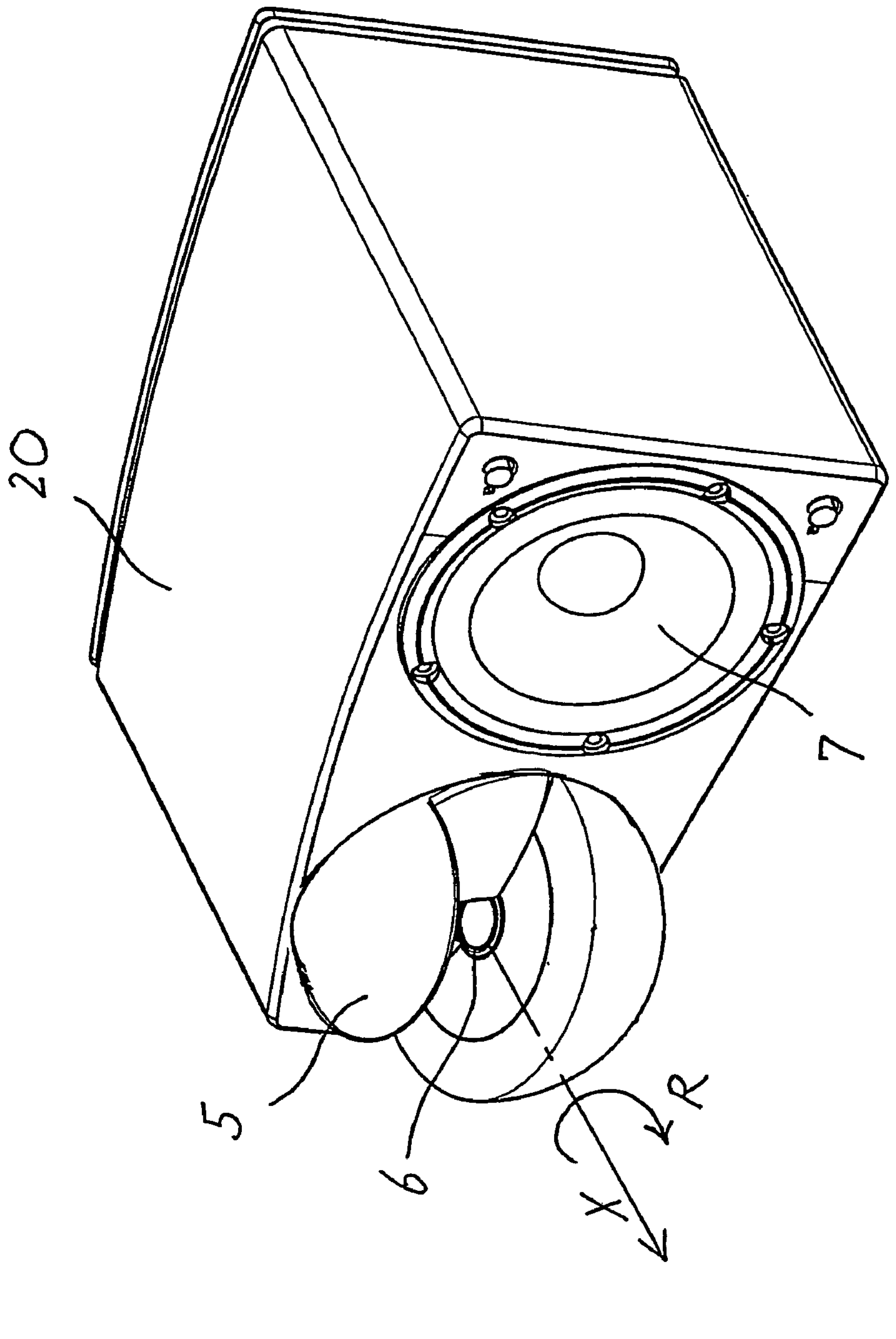
FIG. 4*b* is a perspective view of the monitor shown in FIG. 1 although in a 90 degrees tilted position and with a correspondingly different orientation of the high frequency unit.

FIG. 3 shows a possible extension of the modular monitor comprising two low frequency modules 21, 21' placed on each side of the broadband module 20. In this manner, it is possible to obtain even higher acoustical output at low frequencies than with the single low frequency module as shown in FIGS. 1 and 2. It is understood that in this case the system automatically compensates for the effect on the parameters of the system due to increased baffle effect and acoustical output in overlapping frequency ranges of applying two low frequency modules instead of only one as mentioned in the disclosure of the invention.

In FIGS. 1, 2, 3 and 4*a*, the acoustical lens 5 is shown with the same orientation relative to the broadband module, but according to the invention the lens 5 may be rotated about the axis X through the high frequency unit. This has been done in FIG. 4*b* where the broadband module 2 has furthermore been placed in a position 90 degrees rotated relative to the upright position shown in FIGS. 1, 2, 3 and 4*a*. It is understood, however, that the lens 5 could be rotated any desired angle around the axis X, if desired.

Figure 5:
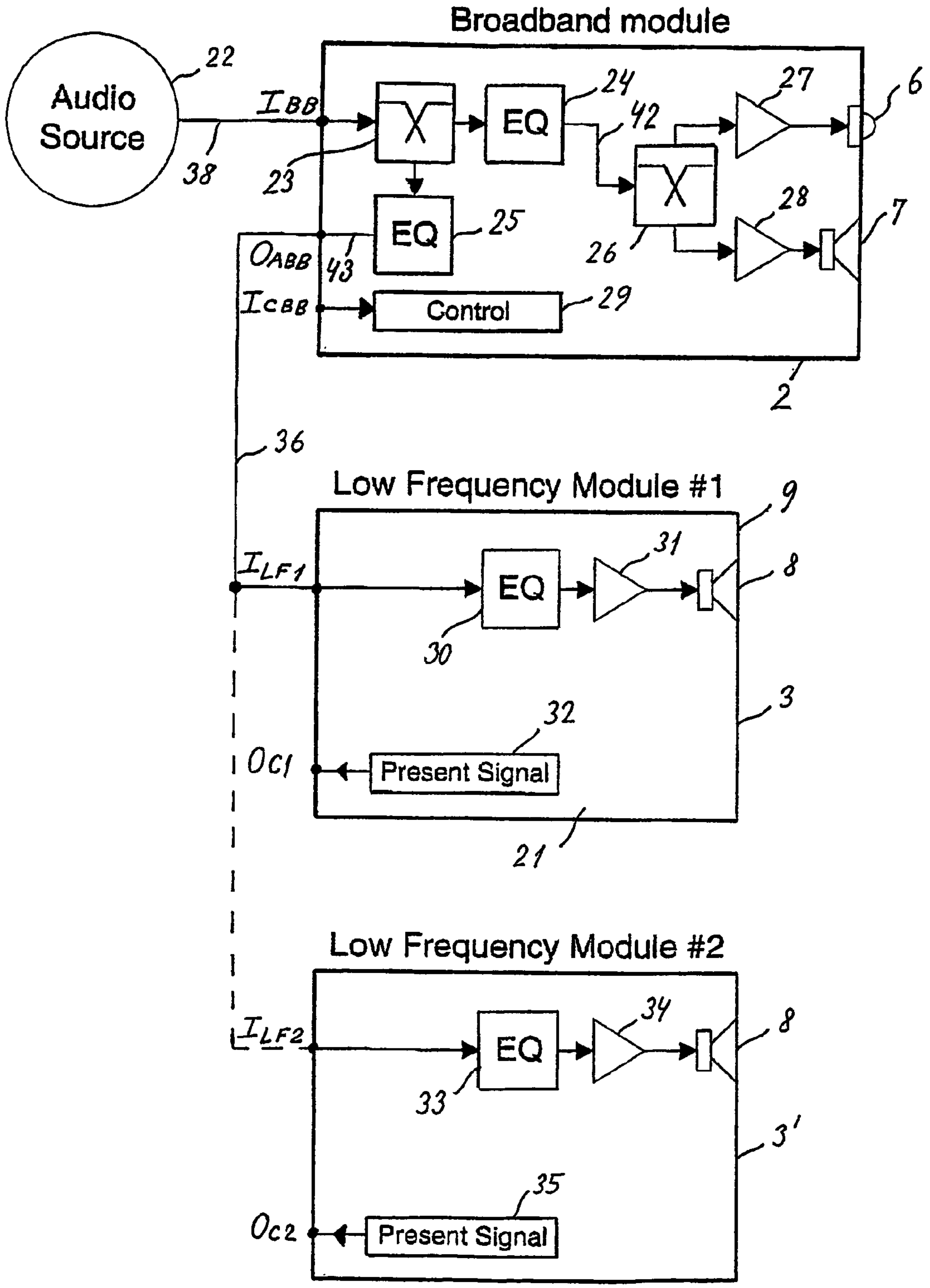
FIG. 5 is a block diagram of the audio signal-processing path through the modular loudspeaker according to one embodiment of the invention.
Figure 6:
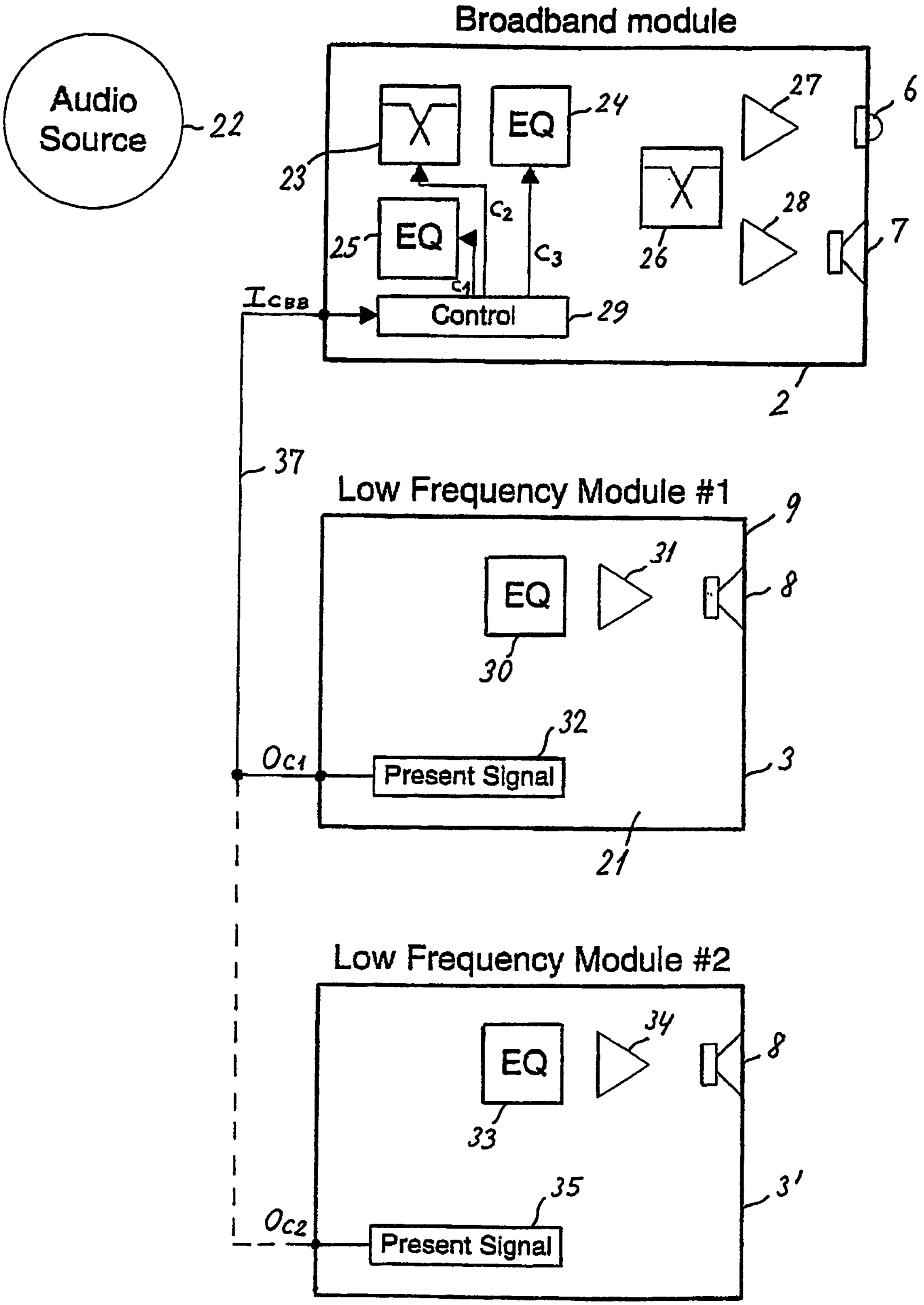
FIG. 6 is a block diagram of the control signal path through the modular loudspeaker according to one embodiment of the invention.
Figure 7A:
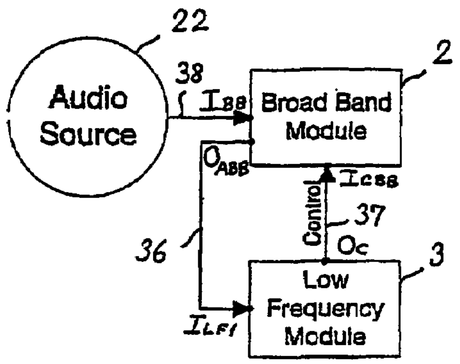
FIGS. 7*a*, 7*b*, 7*c* and 7*d* are block diagrams of audio- and control signal paths according to four alternative embodiments of the invention comprising a broadband module and one low frequency module.
Figure 7B:
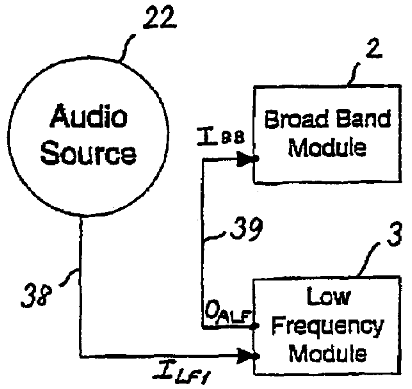
Figure 7C:
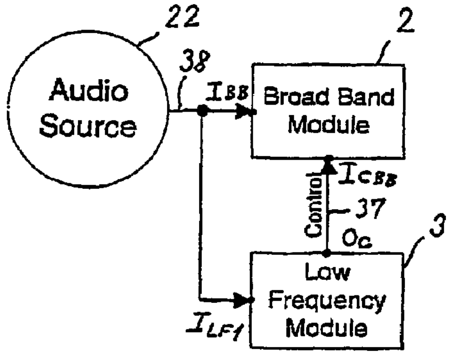
Figure 7D:
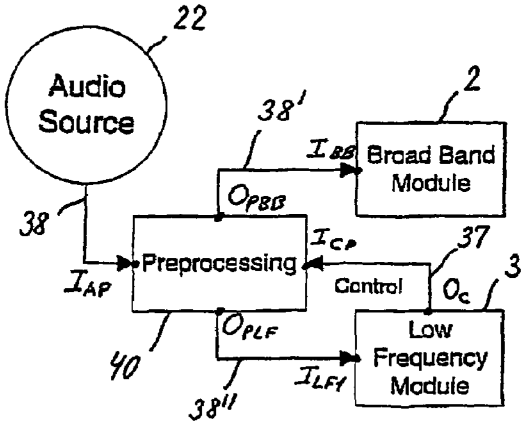

Referring now to FIGS. 5 and 6, there is described one embodiment of a modular loudspeaker according to the invention, the basic structure of which corresponds to the system shown in FIG. 7*a*. In FIGS. 7*b* through 7*d* are shown three alternative embodiments of the structure of a modular loudspeaker according to the invention.

As mentioned in the disclosure of the invention, when said broadband and low frequency modules are combined to an integrated unit, a signal transmission is according to one aspect of the invention established directly between these modules and the establishment of this transmission automatically changes the appropriate parameters of at least one of said modules in such a manner that the parameters (for instance frequency response and directional characteristics) of the combined modular loudspeaker are kept within given predetermined limits, i.e. corresponding to given known target characteristics. As will become apparent from the following description of various embodiments of a modular loudspeaker according to the invention, many different signal paths for distributing audio signals and appropriate control information among the various modules and potential external signal processing means are possible without deviating from the scope of the invention as defined by the appended claims. It should also be emphasised—as already mentioned—that a transfer of necessary information between the various modules and potential external signal processing means can be accomplished by many different means and that the transfer of control information in the form of an electric signal (a present signal indicating the presence and number of low frequency modules in the modular loudspeaker), as described in the following in connection with FIGS. 5 through 8*d*, is only one means of accomplishing this transfer of information. Various non-galvanic transfer means as well as mechanical means acting between closely adjacent modules should naturally suggest themselves to a person skilled in the art. Also, for instance a resistive voltage divider comprising a DC source and a resistor in one module and another resistor in another module would be a possible means for transfer of such information, the information being provided by the level of a DC voltage developed in the voltage divider upon establishment of a connection between for instance two adjacent modules.

According to the embodiment of the present invention shown in FIGS. 5, 6 and 7*a*, said broadband module 2 comprises an input terminal $I_{BB}$ for receiving an audio signal 38 from a signal source 22. After suitable pre-processing in the broadband module, which will be described below, the audio signal 38 is split up into two channels in a crossover network 26 and via appropriate power amplifiers 27, 28 provided to the high frequency driver 6 and the low/mid-frequency driver 7, respectively. It is understood that the broadband module is not limited to a two ways system as shown in the Figures but could as mentioned also comprise for instance a separate mid-frequency driver provided with an appropriate acoustic lens, etc. Prior to the splitting of the signal 38 into two channels in the crossover network 26, the audio signal 38 from the input terminal $I_{BB}$ undergoes a pre-processing necessary in those cases where one or more low frequency modules 3, 3' are coupled to the broadband module 2. Specifically the input signal $I_{BB}$ is provided to a crossover network 23 for dividing the input signal 38 into a signal to be reproduced by the broadband module 2 and a signal to be reproduced by the low frequency module(s). Each of these signals are separately provided to equalisers 24, 25. The output from the equaliser 24 is provided to the crossover network 26 for reproduction via the broadband module 2 and the output from the equaliser 25 is coupled via an output terminal $O_{ABB}$ to the input terminal $I_{LF1}$ of the low frequency module 3, in which it is passed through an equaliser 30 and a power amplifier 31 to the low frequency driver unit 8. Similarly, the output signal from equaliser 25 can be provided as input signal to further low frequency modules (in the Figure represented by one such module 3'). For a description of embodiments comprising two low frequency modules, reference is made to FIGS. 8*a* through 8*d* and the corresponding description.

According to the embodiment shown in FIGS. 5 and 6, the broadband module 2 is furthermore provided with control means 29 for sensing the presence of one or more low frequency modules 3, 3' and consequently changing the characteristics of the crossover network 23 and the equalisers 24, 25 in the broadband module, whereby the resulting frequency response and other pertinent acoustical characteristics of the integrated monitor is brought to fall within predefined limits corresponding to given target characteristics. Said control means may furthermore provide automatic compensation for the so-called baffle effect that arises due to acoustical interaction between the broadband module and the low frequency module, when said low frequency module is placed in close proximity to said broadband module and furthermore for the increased acoustical output in that part of the frequency range of the integrated loudspeaker where a certain overlap between the frequency responses of the broadband and low frequency module takes place. Furthermore, said control means may be designed to be able to compensate for the acoustical effects on the frequency response of the monitor due to reflections from various obstacles in the listening room, for instance from the upper surface of a mixing console located beneath and in front of the monitor. Said compensation for the effect of reflections may of cause be provided by the control means, not only in case of the combined monitor but also when using the broadband module alone. In order to accomplish said control of crossover network and equaliser parameters the control means 29 provides appropriate control signals $c_1$, $c_2$ and $c_3$ to said crossover network 23 and equalisers 24, 25 upon reception of a present signal 37 generated by a present signal generator 32, 35 in the low frequency module(s) 3, 3' and transmitted to the control means 29 through a corresponding input terminal $I_{CBB}$ in the broadband module 2.

Referring now to FIGS. 7*a* through 7*d*, there are schematically shown various possibilities of establishing the necessary signal paths for audio signals and control signals in different embodiments of a modular loudspeaker comprising a broadband module 2 and one low frequency module 3 according to the present invention. Specifically FIG. 7*a* as mentioned above represents the embodiment described in connection with FIGS. 5 and 6, according to which the audio signal 38 is provided to the input terminals $I_{BB}$ of the broadband module 2 and a low frequency portion of the audio signal is passed on via terminal $O_{ABB}$ to the low frequency module 3, which provides the control means 29 in the broadband module with an appropriate present signal 37 for indicating the presence of the low frequency module to the broadband module resulting in the necessary adjustment of crossover network- and equaliser parameters in the broadband module.

Referring to FIG. 7*b* it is, however, also possible to provide the low frequency module with the audio signal 38 directly via terminal $I_{LF1}$ and pass a suitably pre-processed audio signal 39 on to the broadband module 2, the low frequency module 3 being in this case provided with crossover network- and equaliser means for carrying out this pre-processing. An advantage of this embodiment is that it is not necessary to include the generation and transmission of a present signal as in the previous embodiment, as one or more low frequency modules will always co-operate with a broadband module in the modular loudspeaker. The input terminal $I_{BB}$ can also be used for receiving the audio signal 38 in case the broadband module is used without the low frequency module(s).

Referring to FIG. 7*c*, it is also possible to provide both the broadband module 2 and the low frequency module 3 with the same—unprocessed—input signal 38, in which case the low frequency module 3 must be provided with means for generating the present signal 37 to the broadband module 2. Furthermore, the low frequency module 3 will in this embodiment be provided with a suitable low pass filter in order to limit the audio signal amplified in and radiated by the low frequency module to the appropriate low frequency region. Furthermore, according to this embodiment, the broadband module will be provided with a suitable high pass filter and equaliser means for changing the lower limiting frequency of the broadband module and for compensation for the baffle effect due to the presence of the low frequency module, said high pass filter and equaliser being controlled by the present signal 37 from the low frequency module.

Finally, as shown schematically in FIG. 7*d*, it is possible to carry out a required pre-processing entirely outside the modules 2, 3 of the loudspeaker in a separate pre-processing unit 40 comprising input terminals $I_{AP}$ and $I_{CP}$ for the audio signal 38 and a suitable present signal, respectively, and output terminals $O_{PBB}$ and $O_{PLF}$ for each of the pre-processed audio signals for the broadband module and the low frequency module, respectively, which unit 40 could for instance constitute an integrated part of a mixing console or other equipment in a sound studio. In this case each of the modules 2, 3 is provided with separate pre-processed output signals 38', 38" and a present signal 37 from the low frequency module is provided to the pre-processor 40.

As mentioned previously, more than one low frequency module may be used in the modular loudspeaker according to the invention, for instance in order to increase maximum undistorted acoustical output at low frequencies. Thus, the present signal as described above must generally contain information about the number of low frequency modules applied. Furthermore, the low frequency module(s) (3) are generally provided with equaliser means 30, 33, which can either provide a fixed (factory set) equalisation of individual low frequency modules in order to keep the electroacoustic parameters of these modules within given tolerance limits or be provided with means for controlling the setting of the equalisers 30, 33 in response to control signals transmitted from either the broadband module or from another low frequency module. In the latter case, the equalisers 30, 33 may serve as a means for obtaining the target response of the complete modular loudspeaker in co-operation with the pre-processing means 23, 24, 25 in the broadband module 2.

Examples of embodiments of the modular loudspeaker according to the invention comprising two low frequency modules 3, 3' are shown in FIGS. 8*a* through 8*d*.

Figure 8A:
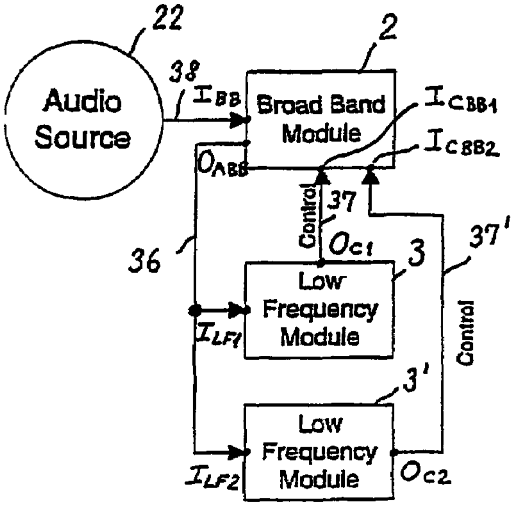
FIGS. 8*a*, 8*b*, 8*c* and 8*d* are block diagrams of audio- and control signal paths according to four alternative embodiments of the invention comprising a broadband module and two low frequency modules.

Specifically FIG. 8*a* corresponds to the embodiment shown in FIG. 7*a*, where the audio signal 38 is provided to the input terminals $I_{BB}$ of the broadband module 2 and a low frequency portion 36 of the audio signal is passed via the output terminal $O_{ABB}$ on to the input terminals $I_{LF1}$ and $I_{LF2}$ of the two low frequency modules 3, 3' which via input terminals $I_{CBB1}$ and $I_{CBB2}$ provides the control means 29 in the broadband module with appropriate present signals 37, 37' for indicating the presence of the two low frequency modules to the broadband module resulting in the necessary adjustment of crossover network- and equaliser parameters in the broadband module. Among other things this adjustment concerns the sensitivity of the low frequency modules, which must be reduced relative to the embodiment of FIG. 7*a* due in this case to the presence of two acoustic radiators. Also appropriate changes of the compensation for the above-mentioned baffle-effect must be carried out, affecting the signal processing carried out in the broadband module.

Figure 8B:
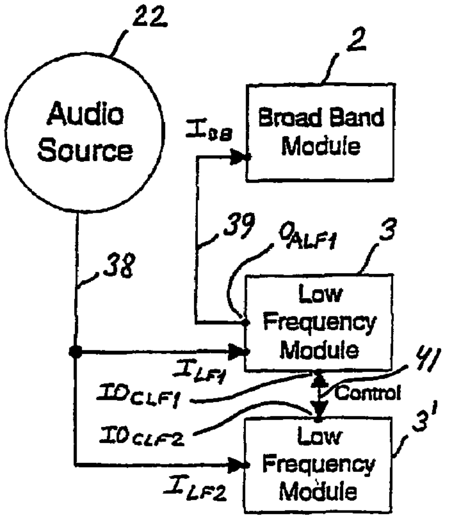

The embodiment shown in FIG. 8*b* corresponds to the embodiment shown in FIG. 7*b* except for the presence of two low frequency modules 3, 3'. A pre-processed audio signal 39 (suitably high pass filtered and compensated for baffle-effect)

is provided from one of the low frequency modules 3 to the broadband module 2 and this low frequency module 3 must thus be provided with crossover network- and equaliser means for carrying out this processing. Furthermore, the two low frequency modules 3, 3' must be provided with means for exchanging control information 41 about their presence to the other low frequency module in order to allow the other low frequency module to carry out sensitivity reductions, which are necessary due to the presence of two low frequency modules.

Figure 8C:
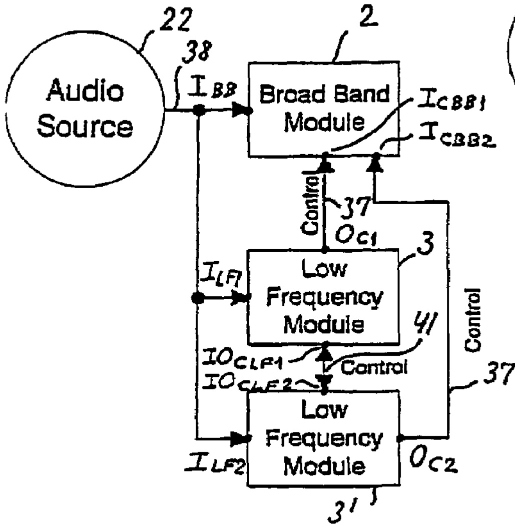

Referring now to FIG. 8*c*, there is shown an embodiment of the invention corresponding to the one shown in FIG. 7*c* but comprising two low frequency modules 3, 3'. In this embodiment, each of the modules 2, 3 and 3' is provided with the audio signal 38 from the signal source 22 and present signals 37, 37' are provided from each of the low frequency modules 3, 3' to the broadband module in order to make the broadband module carry out the necessary changes relating to lower frequency limit and compensation for baffle-effect. Furthermore—as in the embodiment shown in FIG. 8*b*—control information 41 is passed between each of the low frequency modules 3, 3' to initiate said sensitivity changes due to the presence of two low frequency modules. Also—as mentioned in connection with FIG. 7*c* above—the low frequency module (s) comprises suitable low pass filters used for limiting the frequency region of the signals processed by the low frequency module(s).

Figure 8D:
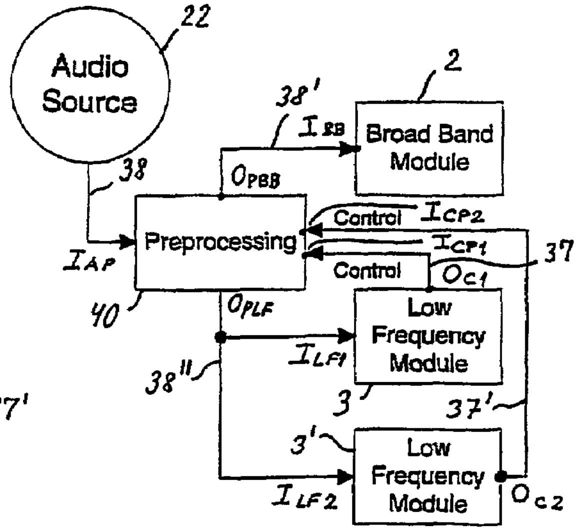

Finally, FIG. 8*d* shows an embodiment corresponding to the one shown in FIG. 7*d* but comprises two low frequency modules 3, 3'. According to this embodiment, present signals 37, 37' are provided by the two low frequency modules to the external pre-processor 40 that divides the audio signal 38 into a broadband portion 38'—with suitable high pass filtration and baffle-effect compensation—and a low frequency portion 38" for the low frequency modules 3, 3'—with suitable low pass filtration and sensitivity adjustments.

Although a number of embodiments of the modular loudspeaker according to the present invention have been shown and described in the preceding parts of the detailed description, it is understood that a person skilled in the art may conceive other embodiments hereof both with respect to the number, kind and placement of the sound radiating units in the modules, the specific construction of the cabinets of the modules and the manners of routing and processing audio— and control signals in and between the modules without departing from the scope of the invention as defined by the following claims. Also the information about the presence of one or more low frequency modules could be provided without the generation of a present signal, for instance through the application of a resistive voltage—or current-dividing network. Wireless transmission of this information could as mentioned also be envisaged and even a mechanical coupling between adjacent modules could be used, this coupling affecting switching means in the module(s).

The invention claimed is:

1. A modular loudspeaker comprising:

a broadband module for the radiation of acoustical energy over a first frequency range; at least one low frequency module for radiation of acoustical energy over a second frequency range, which may at least partially overlap said first frequency range; at least one controllable pre-processing means for pre-processing of audio signals provided from an audio source and for distribution of said pre-processed audio signals between said broadband module and said at least one low frequency module;

control information providing means for providing and transferring control information between said at least one low frequency module and said at least one controllable pre-processing means, for indicating the presence and number of said at least one low frequency module;

whereby said pre-processing means, due to said control information, can sense the presence and number of said at least one low frequency module and thereby carry out appropriate changes of a set of signal processing parameters in order to obtain a given one of a set of predetermined target responses for the complete modular loudspeaker;

said broadband module further comprising, in addition to said at least one controllable pre-processing means, a first input terminal for receiving an audio signal, a first output terminal for providing a pre-processed version of said audio signal and a second input means for receiving control information for said controllable pre-processing means;

said low frequency module further comprising said control information providing means, a third input terminal for receiving an audio signal and a second output means for providing said control information from said control information providing means;

said first output terminal being connected to said third input terminal and said second output means being connected to said second input means whereby said controllable pre-processing means receives said control information provided by said control information providing means.

2. A modular loudspeaker according to claim 1, where said broadband module (2) furthermore comprises: a first input terminal ($I_{BB}$) for receiving an audio signal (39); said low frequency module (3) furthermore comprises: a third input terminal ($I_{LF1}$) for receiving an audio signal (38), a third output terminal ($O_{ALF}$) and pre-processing means for receiving said audio signal (38) and providing a pre-processed version (39) of this signal to said third output terminal ($O_{ALF}$); where said third output terminal ($O_{ALF}$) is connected to said first input terminal ($I_{BB}$), whereby said broadband module (2) receives a pre-processed version (39) of said audio signal (38).

3. A modular loudspeaker according to claim 1, where said broadband module (2) furthermore comprises: said controllable pre-processing means (23, 24, 25), a first input terminal ($I_{BB}$) for receiving an audio signal (38) and a second input means ($I_{CBB}$) for receiving said control information (37) for said controllable pre-processing means (23, 24, 25); said low frequency module (3) further more comprises: said means (32, 35) for the provision of said control information, a third input terminal ($I_{LF1}$) for receiving an audio signal (38) and a second output means ($O_{C1}$) for providing said control information (37) from said control information providing means (32, 35); where said audio signal (38) is connected to said third input terminal ($I_{LF1}$) and said second output means ($O_{C1}$) is connected to said second input means ($I_{CBB}$), whereby said controllable pre-processing means (23, 24, 25) receive said control information provided by said control information providing means (32, 35).

4. A modular loudspeaker according to claim 1, where— said broadband module (2) furthermore comprises: a first input terminal ($I_{BB}$) for receiving an audio signal (38'); said low frequency module (3) furthermore comprises: said means (32, 35) for the provision of control information, a third input terminal (ILF1) for receiving an audio signal (38") and a second output means ($O_{C1}$) for providing said control information (37) from said control information providing means (32, 35); said pre-processing means (40) is provided with a fourth input terminal ($I_{AP}$) for receiving said audio signal (38), a fifth input means (Icp) for receiving said control information (37), a fourth output terminal ($O_{PBB}$) for providing a first pre-processed portion (38') of said audio signal (38) and a fifth output terminal ($O_{PLF}$) for providing a second pre-processed portion (38") of said audio signal (38); where said fourth output terminal ($O_{PBB}$) is connected to said first input terminal ($I_{BB}$), said fifth output terminal ($O_{PLF}$) is connected to said third input terminal ($I_{LF1}$) and said second output means (Oc) is connected to said fifth input means (Icp).

5. A modular loudspeaker according to claim 1, further comprising a second low frequency module, said second low frequency module further comprising:

said control information providing means, a sixth input terminal for receiving said audio signal received by said third and a sixth output means for providing said control information from said control information providing means; wherein said broadband module further includes a seventh input means for receiving said control information for controlling said controllable pre-processing means in said broadband module, whereby said broadband module can sense the presence of said second low frequency module thereby carrying out appropriate changes of the pre-processing of said audio signal provided at the first input terminal, and wherein said sixth output means is connected to said seventh input means.

6. A modular loudspeaker according to claim 2, furthermore comprising a second low frequency module (3') with a sixth input terminal ($I_{LF2}$) for receiving an audio signal (38), where both said first and second low frequency modules (3, 3') are provided with control information providing means and controllable pre-processing means responsive to said control information (41) for pre-processing of the audio signals (38) provided to said third input terminal ($I_{LF1}$) of the first low frequency module (3) and to said sixth input terminal ($I_{LF2}$) of the second low frequency module (3'); whereby said first and second low frequency module (3, 3') can sense the presence of each other and thereby carry out appropriate changes of the processing of said audio signals (38) carried out by said pre-processing means of each of said low frequency modules (3, 3').

7. A modular loudspeaker according to claim 3, furthermore comprising a second low frequency module (3') with a sixth input terminal ($I_{LF2}$) for receiving an audio signal (38); where both said first and second low frequency modules (3, 3') are provided with control information providing means and controllable pre-processing means responsive to said control information (41) for pre-processing of the audio signals (38) provided to said third input terminal ($I_{LF1}$) of the first low frequency module (3) and to said sixth input terminal ($I_{LF2}$) of the second low frequency module (3'), whereby said first and second low frequency module (3, 3') can sense the presence of each other and thereby carry out appropriate changes of the processing of said audio signals (38) carried out by said pre-processing means of each of said low frequency modules (3, 3'), and where said second low frequency module (3') is furthermore provided with a sixth output means ($O_{C2}$) for providing said control information (37') to the pre-processing means in said broadband module (2) via a seventh input means ($I_{CBB2}$) in said broadband module (2), whereby said broadband module can sense the presence of said second low frequency module (3') and thereby carry out appropriate changes of the pre-processing of audio signals (38) carried out by said controllable pre-processing means of said broadband module (2).

8. A modular loudspeaker according to claim 4, furthermore comprising a second low frequency module (3') with a sixth input terminal ($I_{LF2}$) for receiving said audio signal (38'); said low frequency module (3') furthermore comprising: said means (32, 35) for the provision of control information; a sixth input terminal ($I_{LF2}$) for receiving an audio signal (38') and a sixth output means ($O_{C2}$) for providing said control information (37') from said control information providing means (32, 35); where said pre-processing means (40) is furthermore provided with a fifth input means ($I_{CP}$) for receiving said control information (37), and a fifth output terminal ($O_{PLF}$) for providing a second pre-processed portion (38') of said audio signal (38) to the input terminals ($I_{LF1}$, $I_{LF2}$) of said first and second low frequency modules (3, 3'), respectively.

9. A broadband module for use in said modular loudspeaker according to claim 1, comprising a cabinet with a front and at least two sound radiating units, wherein a directional characteristic relative to said cabinet of at least one of said sound radiating units can be controlled.

10. A broadband module according to claim 9, comprising a high frequency radiating unit, a directional characteristic of which relative to said cabinet can be controlled.

11. A broadband module according to claim 10, where said frequency radiating unit is provided with means for adjustment of the orientation of said high frequency radiating units within predefined limits relative to said cabinet.

12. A broadband module according to claim 11, where said adjustment means allows rotation of said high frequency radiating unit about the longitudinal axis through said unit.

13. A broadband module according to claim 12, where said longitudinal axis extends substantially perpendicularly out of the front of the cabinet.

14. A broadband module according to claim 9, further comprising a mid-frequency radiating unit, the directional characteristic of which relative to said cabinet can be controlled.

15. A broadband module system for use in a modular loudspeaker, said system comprising:

a broadband module for the radiation of acoustical energy over a first frequency range; at least one low frequency module for radiation of acoustical energy over a second frequency range, which may at least partially overlap said first frequency range; at least one controllable pre-processing means for pre-processing of audio signals provided from an audio source and for distribution of said pre-processed audio signals between said broadband module and said at least one low frequency module;

control information providing means for providing and transferring control information between said at least one low frequency module and said at least one controllable pre-processing means, for indicating the presence and number of said at least one low frequency module;

whereby said pre-processing means, due to said control information, can sense the presence and number of said at least one low frequency module and thereby carry out appropriate changes of a set of signal processing parameters in order to obtain a given one of a set of predetermined target responses for the complete modular loudspeaker;

said broadband module system comprising a cabinet with a front and at least two sound radiating units, wherein a directional characteristic relative to said cabinet of at least one of said sound radiating units can be controlled; and further comprising an input terminal for receiving an audio signal, said audio signal being provided to controllable pre-processing parameter adjusting means for controlling various signal processing parameters of the broadband module and providing first and second output signals, wherein the first of said output signals, is coupled to said at least two sound radiating units via a cross-over network and a plurality of power amplifiers, and wherein the second of said signal output signals is accessible from outside said broadband module via an output terminal, and wherein said broadband module is further provided with means for controlling said parameter adjustment means upon reception of external control information provided to said control means via a corresponding input means.

16. A broadband module according to claim 15, where said control information is a control signal provided to said control via a said corresponding input terminal.

* * * * *